United States Patent [19]

Takemae

[11] Patent Number: 4,468,576
[45] Date of Patent: Aug. 28, 1984

[54] INVERTER CIRCUIT HAVING TRANSISTORS OPERABLE IN A SHALLOW SATURATION REGION FOR AVOIDING FLUCTUATION OF ELECTRICAL CHARACTERISTICS

[75] Inventor: Yoshihiro Takemae, Yokohama, Japan

[73] Assignee: Fujitsu Limited, Kawasaki, Japan

[21] Appl. No.: 392,346

[22] Filed: Jun. 25, 1982

[30] Foreign Application Priority Data

Jun. 29, 1981 [JP] Japan ................................ 56-99746

[51] Int. Cl.³ .................. H03K 19/096; H03K 5/153; H03K 17/14; H03K 17/06
[52] U.S. Cl. ................................... 307/481; 307/453; 307/578; 307/269
[58] Field of Search ............... 307/452, 453, 442, 443, 307/480, 481, 482, 571, 575, 577, 578, 579, 582, 583, 200 B, 269, 270; 361/190

[56] References Cited

U.S. PATENT DOCUMENTS

| | | | |
|---|---|---|---|
| 3,845,324 | 10/1974 | Feucht | 307/482 X |
| 3,991,326 | 11/1976 | Kawagoe et al. | 307/270 |
| 4,069,430 | 1/1978 | Masuda | 307/270 |
| 4,408,136 | 10/1983 | Kirsch | 307/453 X |

FOREIGN PATENT DOCUMENTS

| | | | |
|---|---|---|---|
| 87933 | 7/1981 | Japan | 307/575 |
| 60732 | 4/1982 | Japan | 307/480 |

Primary Examiner—Larry N. Anagnos
Assistant Examiner—David R. Bertelson
Attorney, Agent, or Firm—Staas & Halsey

[57] ABSTRACT

An inverter circuit which comprises a load transistor ($Q_1$) and a driving transistor ($Q_2$) is connected in series between first and second power supplies ($V_{ss}$, $V_{pp}$). At least one transistor ($Q_3$) for reducing the load of the load transistor is connected between the load transistor and the second power supply ($V_{pp}$). A bootstrap circuit is connected to the gate of the transistor ($Q_3$) and the gate potential of the transistor ($Q_3$) is raised to a potential level higher than that of the second power supply ($V_{pp}$).

6 Claims, 7 Drawing Figures

INVERTER CIRCUIT HAVING TRANSISTORS OPERABLE IN A SHALLOW SATURATION REGION FOR AVOIDING FLUCTUATION OF ELECTRICAL CHARACTERISTICS

BACKGROUND OF THE INVENTION

1. Field of the Invention

The present invention relates to an inverter circuit which is, for example, used as an output stage of a word driver in metal-oxide semiconductor (MOS) memory devices.

2. Description of the Prior Art

In recent years, in MOS (broadly, metal-insulated semiconductor (MIS)) memory devices, the potential of a power supply has been gradually decreased. Therefore, if a signal having a particularly high potential is required, such a high potential signal is generated by using a charge-pumping circuit or the like. For example, such a high-potential signal is supplied as a clock signal to an inverter circuit which serves as an output stage of a word driver in MOS memory devices.

One prior art inverter circuit comprises two MOS transistors: a load transistor on the side of a high-potential power supply and a driving transistor on the side of a low-potential power supply. In this case, the two transistors are connected in series between the high-and low-potential power supplies. Two clock signals, which are approximately opposite in phase are supplied to the gates of the two transistors, respectively, while the connection node between the two transistors serves as an output terminal of the inverter circuit.

In the above-mentioned prior art inverter circuit, however, when the load transistor and the driving transistor are in an off state and an on state, respectively, the potential at the connection node is low. Therefore, a high potential is applied directly to the load transistor, which, in turn, operates in a deep saturation region. As a result, a large amount of hot electrons and hot holes having high energy are generated and captured by a gate oxide layer so that the electrical characteristics, such as the threshold voltage ($V_{th}$) value, of the load transistor fluctuate. In addition, since the load transistor operates in a state near to a punch-through state during the conduction mode in the deep saturation region, the load transistor may break down.

Similarly, when the load transistor and the driving transistor are in an on state and an off state, respectively, the potential at the connection node is high. Therefore, a high potential is also applied directly to the driving transistor, which, in turn, operates in a deep saturation region. Therefore, the above-mentioned phenomenon also occurs in the driving transistor.

SUMMARY OF THE INVENTION

It is, therefore, an object of the present invention to provide an inverter circuit comprising a load transistor and a driving transistor connected in series, in which both of the transistors can be operated in a shallow saturation region, thereby avoiding fluctuation of the electrical characteristics, such as threshold voltage ($V_{th}$) values, of these transistors and the breakdown of these transistors.

According to the present invention, there is provided an inverter circuit comprising: a low-potential power supply; a first high-potential power supply; a second high-potential power supply, the potential of the second high-potential power supply being higher than that of the first high-potential power supply; a clock signal generating means for generating first and second clock signals approximately opposite in phase; and a load MIS transistor and a driving MIS transistor connected in series between the low-potential power supply and the second high-potential power supply, the load MIS transistor and the driving MIS transistor each having a gate for receiving one of the clock signals. The present invention also comprises a connection node, between the load MIS transistor and the driving MIS transistor, generating an output signal; at least one first MIS transistor connected between the first high-potential power supply and the load MIS transistor; and a means for raising a gate potential of the first MIS transistor to a potential level higher than that of the second high-potential power supply.

The present invention will be more clearly understood from the description as set forth below contrasting the present invention with the prior art and with reference to the accompanying drawings.

BRIEF DESCRIPTION OF THE DARWINGS

DESCRIPTION OF THE PREFERRED EMBODIMENTS

Figure 1:
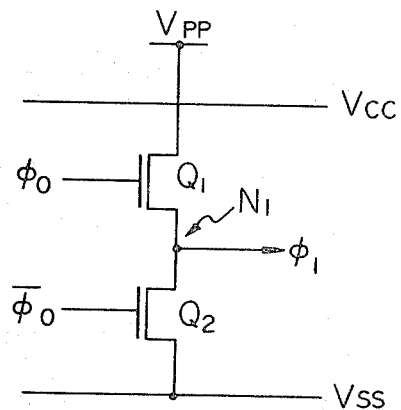
FIG. 1 is a circuit diagram of a prior art inverter circuit.
Figure 2:
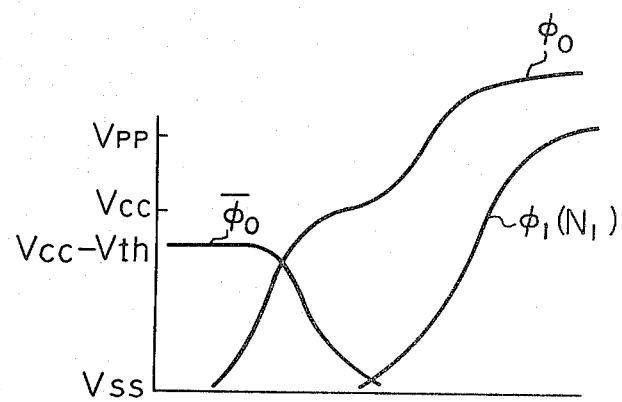
FIG. 2 is a timing diagram of the signals appearing in the circuit of FIG. 1.

First, the prior art inverter circuit will be explained with reference to FIGS. 1 and 2. In FIG. 1, $V_{SS}$, $V_{CC}$, and $V_{PP}$ are power supplies. In this case, $V_{SS}$, $V_{CC}$, and $V_{PP}$ indicate also the potential values of the power supplies $V_{SS}$, $V_{CC}$, and $V_{PP}$, respectively. In more detail, the potential $V_{SS}$ is low while the potential $V_{CC}$ is high. Further, the potential $V_{PP}$ is higher than the potential $V_{CC}$. For example, the potential $V_{PP}$ is generated by a charge-pumping circuit or the like.

The inverter circuit of FIG. 1 comprises a load MIS transistor $Q_1$ and a driving transistor $Q_2$ connected in series between the power supply $V_{SS}$ and the power supply $V_{PP}$. A clock signal $\phi_0$ and its inverted signal $\bar{\phi}_0$ are supplied to the gates of the transistors $Q_1$ and $Q_2$, respectively, and an output signal $\phi_1$ is obtained at the connection node of the two transistors. In this case, the high-level potential of the signal $\phi_0$ is set at a higher value than the power supply potential $V_{PP}$ by using the bootstrap effect or the like. Therefore, the high-level potential of the output signal $\phi_1$ becomes the same as the power supply potential $V_{PP}$.

The operation of the circuit of FIG. 1 will be explained with reference to FIG. 2. Note that $V_{th}$ indicates a common theshold voltage of the transistors. When the potentials of the clock signals $\phi_0$ and $\bar{\phi}_0$ are low ($V_{SS}$) and high ($V_{CC}-V_{th}$), respectively, the transistors $Q_1$ and $Q_2$ are in an off state and an on state, respectively, so that the potential of the output signal $100_1$ is low ($V_{SS}$). Next, when the potential of the signal $\phi_0$ is changed from low ($V_{SS}$) to high ($>V_{PP}$) and, simultaneously, the potential of the signal $\bar{\phi}_0$ is changed from high ($V_{CC}-V_{th}$) to low ($V_{SS}$), the transistors $Q_1$ and $Q_2$ change to an on state and an off state, respectively. As a result, the potential of the output signal $\phi_1$ increases. In this case, since the potential of the signal $\phi_0$ is set at a higher value than $V_{PP}$ by using the bootstrap effect or the like, the potential of the output signal $\phi_1$ is pulled up to the high power supply potential $V_{PP}$, as illustrated in FIG. 2.

In FIG. 1, however, when the potential of each of the signals $\phi_0$ and $\bar{\phi}_0$ remains low ($V_{SS}$) and high ($V_{CC}-V_{th}$), respectively, the large difference $V_{PP}$ in potential is applied between the drain and source of the load transistor $Q_1$, which causes the transistor $Q_1$ to be operated in a deep saturation region. Therefore, as explained above, the electrical characteristics, such as the threshold voltage ($V_{th}$) value, of the load transistor $Q_1$ may fluctuate, and, in addition, breakdown of the load transistor $Q_1$ may occur. Similarly, when the potential of each of the signals $\phi_0$ and $\bar{\phi}_0$ remains high ($>V_{PP}$) and low ($V_{SS}$), respectively, the large difference $V_{PP}$ in potential is applied to the drain and source of the driving transistor $Q_2$. Therefore, the above-mentioned phenomenon also occurs in the driving transistor $Q_2$.

Figure 3:
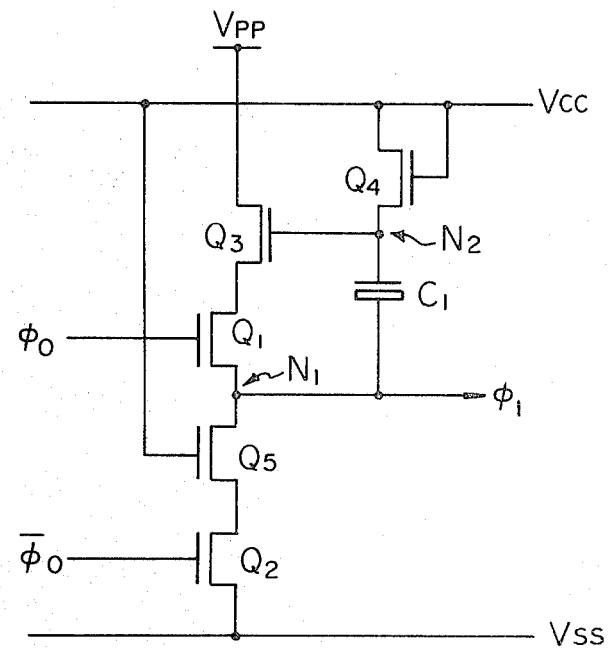
FIG. 3 is a circuit diagram of an embodiment of the inverter circuit according to the present invention.

FIG. 3 is a circuit diagram illustrating an embodiment of the inverter circuit according to the present invention. In FIG. 3, the transistors $Q_3$, $Q_4$, and $Q_5$ and a capacitor $C_1$ are added to the elements of FIG. 1. Note that the transistor $Q_4$ and the capacitor $C_1$ form a bootstrap circuit.

By the addition of the transistor $Q_3$, when the signals $\phi_0$ and $\bar{\phi}_0$ are low ($V_{SS}$) and high ($V_{CC}-V_{th}$), respectively, the large difference $V_{PP}$ in potential is divided by the two transistors $Q_1$ and $Q_3$, thereby reducing the load on the load transistor $Q_1$. By the addition of the transistor $Q_5$, when the signals $\phi_0$ and $\bar{\phi}_0$ are high ($>V_{PP}$) and low ($V_{SS}$), respectively, the large difference $V_{PP}$ in potential is divided by the two transistors $Q_2$ and $Q_5$, thereby reducing the load on the driving transistor $Q_2$.

Figure 4:
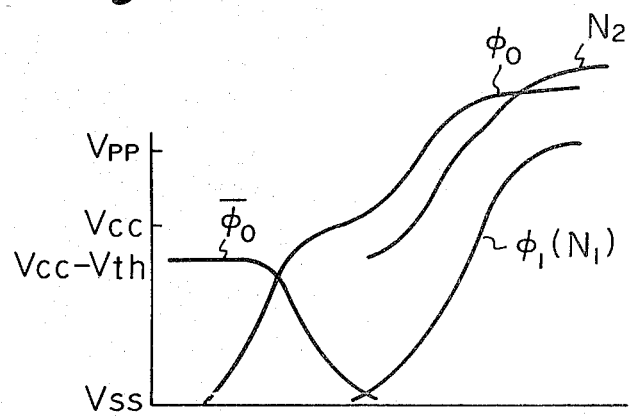
FIG. 4 is a timing diagram of the signals appearing in the circuit of FIG. 3.

The operation of the circuit of FIG. 3 will be explained with reference to FIG. 4. When the potentials of the signals $\phi_0$ and $\bar{\phi}_0$ are low ($V_{SS}$) and high ($V_{CC}-V_{th}$), respectively, the transistors $Q_1$ and $Q_2$ are in an off state and an on state, respectively, so that the potential at the node $N_1$, that is, the potential of the output signal $\phi_1$, becomes low ($V_{SS}$). Simultaneously, current flows from the power supply $V_{CC}$ through the transistor $Q_4$ to the node $N_2$, so that the capacitor $C_1$ is charged. In this case, the potential at the node $N_2$ equals $V_{CC}-V_{th}$. Note that, in this state, the large difference $V_{PP}$ in potential is divided by the two transistors $Q_1$ and $Q_3$, and, accordingly, the drain-source voltage of the load transistor $Q_1$ is decreased.

Next, when the potential of the signal $\phi_0$ is changed from low ($V_{SS}$) to high ($>V_{PP}$) and, in addition, the signal $\bar{\phi}_0$ is changed from high ($V_{CC}-V_{th}$) to low, ($V_{SS}$) the transistors $Q_1$ and $Q_2$ change to an on state and an off state, respectively, and, simultaneously, the transistor $Q_3$ changes to an on state due to the high potential at the node $N_2$. Therefore, current flows from the power supply $V_{PP}$ through the transistors $Q_3$ and $Q_1$ to the node $N_1$, which, in turn, increases the potential of the node $N_1$. At this time, since the transistor $Q_4$ is cut off due to the fact that the gate-source voltage of the transistor $Q_4$ is less than the threshold voltage ($V_{th}$) value thereof, the potential at the node $N_2$ increases as the potential at the node $N_1$ increases. Therefore, the potential at the node $N_2$ becomes higher than the potential $V_{CC}$ and, finally, this potential becomes substantially higher than the potential $V_{PP}$. Such pushing up of the potential at the node $N_2$ is called the bootstrap effect. Thus, since a substantially higher potential than the potential $V_{PP}$ is applied to the gates $Q_3$ and $Q_1$, the potential at the node $N_1$, that is, the potential of the output signal $\phi_0$, equals the potential $V_{PP}$. Note that, even in this state, the large difference $V_{PP}$ in potential is divided by the two transistors $Q_2$ and $Q_5$, and, accordingly, the drain-source voltage of the driving transistor $Q_2$ is decreased.

That is, the output waveform (FIG. 4) of the inverter circuit of FIG. 3 is about the same as the output waveform (FIG. 2) of the circuit of FIG. 1.

Figure 5:
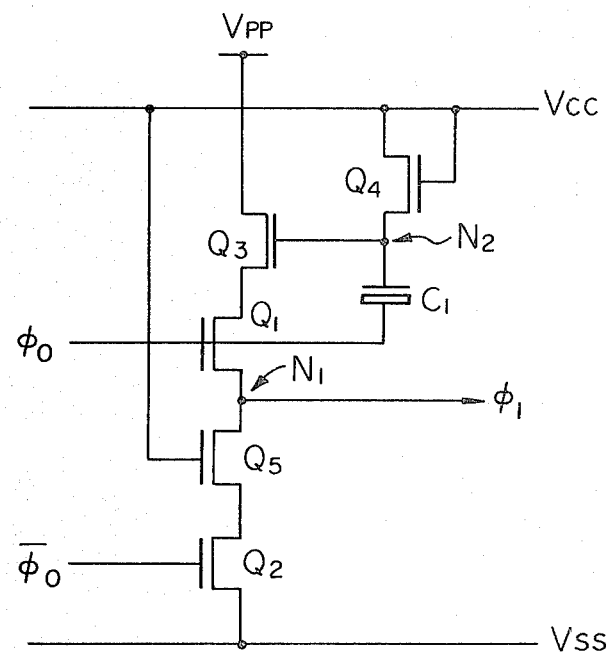
FIG. 5 is a circuit diagram of another embodiment of the inverter according to the present invention.

FIG. 5 is a circuit diagram illustrating another embodiment of the inverter circuit according to the present invention. In FIG. 5, the capacitor $C_1$ is connected to the gate of the load transistor $Q_1$, not to the node $N_1$. Therefore, in this case, the potential at the node $N_2$ is pushed up by the increase of the potential of the signal $\phi_0$ to cause the bootstrap effect.

Figure 6:
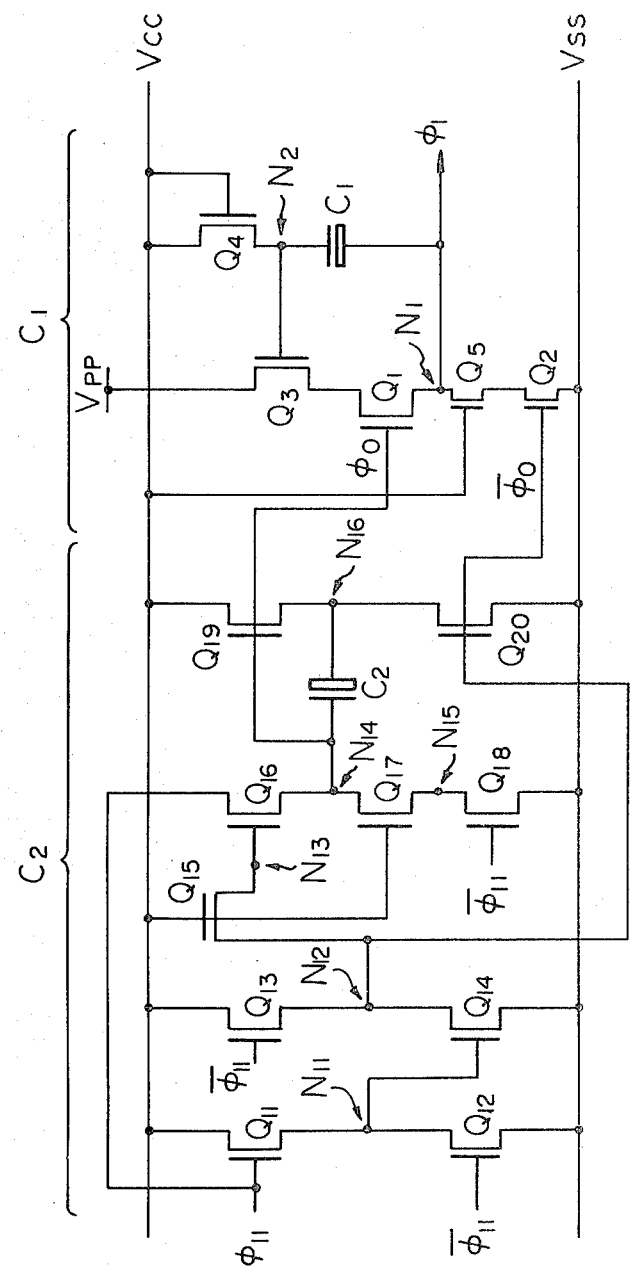
FIG. 6 is a circuit diagram in which the circuit of FIG. 3 is applied to a word driver circuit for generating a word line driving signal.

FIG. 6 is a circuit diagram in which the circuit of FIG. 3 is applied to a word driver circuit for generating a word line driving signal. In FIG. 6, $C_1$ indicates the circuit of FIG. 3, and $C_2$ is a circuit for generating the clock signals $\phi_0$ and $\bar{\phi}_0$.

In the circuit $C_2$, the transistors $Q_{11}$ and $Q_{12}$ comprise an inverter which is operated by receiving clock signals $\phi_{11}$ and $\bar{\phi}_{11}$ which are opposite in phase. The transistors $Q_{13}$ and $Q_{14}$ also comprise an inverter circuit which is operated by receiving the clock signal $\bar{\phi}_{11}$ and the potential at the node $N_{11}$ of the pre-stage inverter circuit. A transistor $Q_{15}$ is interposed between the second stage inverter circuit and a bootstrap circuit. This bootstrap circuit is formed by the transistors $Q_{16}$ through $Q_{20}$ and a capacitor $C_2$. Among them, the transistor $Q_{17}$ is used to protect the transistor $Q_{18}$ when the bootstrap potential node $N_{14}$ is discharged. That is, when the bootstrap potential at the node $N_{14}$ is paticularly high, such high potential is divided by the two transistors $Q_{17}$ and $Q_{18}$, thereby reducing the drain-source voltage of the transistor $Q_{18}$.

Figure 7:
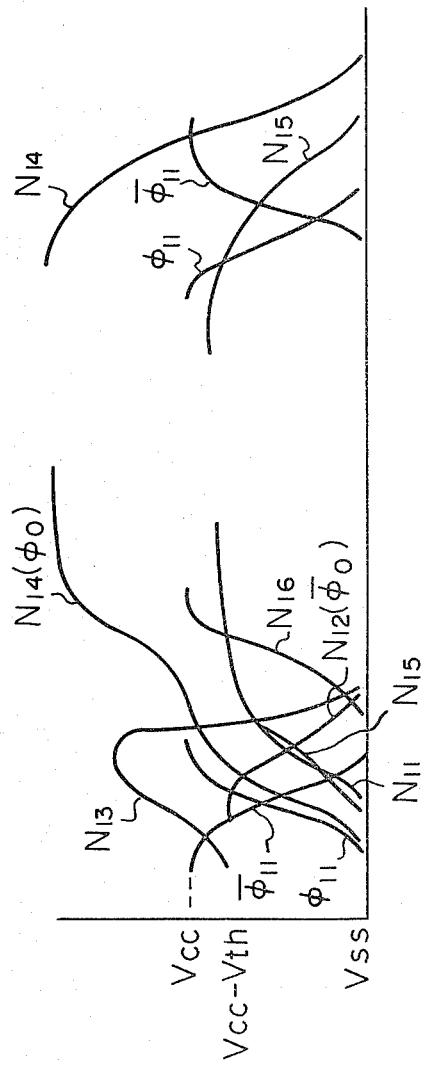
FIG. 7 is a timing diagram of the signals appearing in the circuit of FIG. 6.

The operation of the circuit of FIG. 6 will now be explained with reference to FIG. 7. First, when the potentials of the clock signals $\phi_{11}$ and $\bar{\phi}_{11}$ are low ($V_{SS}$) and high ($V_{CC}$), respectively, the transistors $Q_{12}$ and $Q_{13}$ are in an on state so that the potentials at the nodes $N_{11}$ and $N_{12}$ are low ($V_{SS}$) and high ($V_{CC}-V_{th}$), respectively. In addition, since the transistor $Q_{15}$ is in an on state, the node $N_{13}$ is charged up to the potential $V_{CC}-V_{th}$. Next, when the potentials of the signals $\phi_{11}$ and $\bar{\phi}_{11}$ becomes high ($V_{CC}$) and low ($V_{SS}$), respectively, the transistors $Q_{11}$ and $Q_{12}$ turn on and off, respectively. Therefore, the potential at the node $N_{11}$ becomes high, and, accordingly, the transistor $Q_{14}$ turns on so that the potential at the node $N_{12}$ becomes low since the transistor $Q_{13}$ has already turned off. Thus, after the potential of the signal $\phi_{11}$ becomes high ($V_{CC}$), the potential at the node $N_{12}$ is changed from high ($V_{CC}-V_{th}$) to low ($V_{SS}$) with some delay. In addition, the node $N_{14}$ is charged by the signal $\phi_{11}$. In this case, the discharging of the node $N_{12}$ is carried out later than the charging of the node $N_{14}$. Therefore, the node $N_{13}$ is discharged by the transistor $Q_{15}$, which cuts off the transistor $Q_{16}$. Thus, at this time, the node $N_{14}$ changes to a floating state. Simultaneously, the transistor $Q_{20}$ is cut off so that the potential at the node $N_{16}$ changes from low ($V_{SS}$) to high ($V_{CC}$). As a result, the potential at the node $N_{14}$ is pushed up to a higher level than the potential $V_{CC}$ by the capacitive coupling of the capacitor $C_2$. Thus, a particularly higher potential than the potential $V_{CC}$ is obtained at the node $N_{14}$. Note that such particularly high potential at the node $N_{14}$ is divided by the transistors $Q_{17}$ and $Q_{18}$, thereby reducing the load of the transistor $Q_{18}$. Next, when the signals $\phi_{11}$ and $\bar{\phi}_{11}$ are reversed, the transistor $Q_{18}$ turns on, and, as a result, the charges stored at the node $N_{14}$ are discharged through the on-state transistors $Q_{17}$ and $Q_{18}$.

In the above-mentioned embodiments, only the transistor $Q_3$ (or $Q_5$) is connected in series to the transistor $Q_1$ (or $Q_2$); however, two or more transistors can be connected in series to the transistor $Q_1$ (or $Q_2$).

As explained hereinbefore, the inverter circuit according to the present invention is advantageous in that the load transistor and the driving transistor can be operated in a shallow saturation region, thereby avoiding fluctuation of the electrical characteristics, such as the threshold voltage value, and the breakdown of the transistors.

I claim:

1. An inverter circuit, comprising:
   a low-potential power supply;
   a first high-potential power supply;
   a second high-potential power supply, the potential of said second high-potential power supply being higher than that of said first high-potential power supply;
   clock signal generating means, operatively connected to said first high-potential power supply, for generating first and second clock signals approximately opposite in phase;
   a load MIS transistor and a driving MIS transistor operatively connected in series between said low-potential power supply and said second high-potential power supply, said load MIS transistor and said driving MIS transistor each having a gate for receiving a respective one of said clock signals;
   a connection node, formed between said load MIS transistor and said driving MIS transistor, for outputting an output signal;
   at least one first MIS transistor, operatively connected between said second high-potential power supply and said load MIS transistor, having a gate; and
   means, operatively connected to said first high-potential power supply and said gate of said first MIS transistor, for raising a gate potential of said first MIS transistor to a potential level higher than that of said second high-potential power supply.

2. An inverter circuit as set forth in claim 1, wherein said means for raising the gate potential comprises:
   a second MIS transistor having a drain and a gate commonly connected to said first high-potential power supply and having a source operatively connected to the gate of said first MIS transistor; and
   a capacitor having a first electrode operatively connected to said source of said second MIS transistor and having a second electrode operatively connected to said connection node.

3. An inverter circuit being operatively connectable to a low-potential power supply, first and second high-potential power supplies and clock signal generating means for generating first and second clock signals approximately opposite in phase, the potential of the second high-potential power supply being higher than that of the first high-potential power supply, said inverter circuit comprising:
   a load transistor, operatively connected to the clock signal generating means and the second high-potential power supply, having a gate for receiving the first clock signal;
   a driving transistor, operatively connected to said load transistor, the low-potential power supply and the clock signal generating means, having a gate for receiving the second clock signal;
   a first transistor having a gate, operatively connected between said load transistor and the second high-potential power supply, for reducing the load on said load transistor;
   a second transistor, operatively connected between said load transistor and said driving transistor and operatively connected to the second high-potential power supply, forming a connection node between said second transistor and said load transistor and for reducing the load on said driving transistor; and
   raising means, operatively connected to the first high-potential power supply and the gate of said first transistor, for raising the potential on the gate of said first transistor to a potential level higher than that on the gate of the second high-potential power supply.

4. An inverter circuit as set forth in claim 3, wherein said raising means comprises:
   a third transistor operatively connected to the first high-potential power supply and said first transistor; and
   a capacitor having a first electrode operatively connected to said third transistor and having a second electrode operatively connected to the connection node.

5. An inverter circuit, comprising:
   a low-potential power supply;
   a first high-potential power supply;
   a second high-potential power supply, the potential of said second high-potential power supply being higher than that of said first high-potential power supply;
   clock signal generating means, operatively connected to said first high-potential power supply, for generating first and second clock signals approximately opposite in phase;
   a load MIS transistor and a driving MIS transistor operatively connected in series between said low-potential power supply and said second high-potential power supply, said load MIS transistor and said driving MIS transistor each having a gate for receiving a respective one of said clock signals;
   a connection node, formed between said load MIS transistor and said driving MIS transistor, for outputting an output signal;
   at least one first MIS transistor, operatively connected between said second high-potential power supply and said load MIS transistor, having a gate; and
   means, operatively connected to said first high-potential power supply and the gate of said first MIS transistor, for raising a gate potential of said first MIS transistor to a potential level higher than that of said second high-potential power supply, said means comprising:

a second MIS transistor having a drain and a gate commonly connected to said first high-potential power supply and having a source operatively connected to the gate of said first MIS transistor; and a capacitor having a first electrode operatively connected to the source of said second MIS transistor and to the gate of said first MIS transistor and having a second electrode operatively connected to the gate of said load MIS transistor.

6. An inverter circuit being operatively connectable to a low-potential power supply, first and second high-potential power supplies and clock signal generating means for generating first and second clock signals approximately opposite in phase, the potential of the second high-potential power supply being higher than that of the first high-potential power supply, said inverter circuit comprising:

a load transistor, operatively connected to the clock signal generating means and the second high-potential power supply, having a gate for receiving the first clock signal;

a driving transistor, operatively connected to said load transistor, the low-potential power supply and the clock signal generating means, having a gate for receiving the second clock signal;

a first transistor having a gate, operatively connected between said load transistor and the second high-potential power supply, for reducing the load on said load transistor;

a second transistor, operatively connected between said load transistor and said driving transistor and operatively connected to the second high-potential power supply, forming a connection node between said second transistor and said load transistor and for reducing the load on said driving transistor; and raising means, operatively connected to the first high-potential power supply and the gate of said first transistor, for raising the potential of said first transistor to a potential level higher than that of the second high-potential power supply, said raising means comprising:

a third transistor operatively connected to the first high-potential power supply and said first transistor; and a capacitor having a first electrode operatively connected to said third transistor and to the gate of said first transistor and having a second electrode operatively connected to the gate of said load transistor.

* * * * *

UNITED STATES PATENT AND TRADEMARK OFFICE
CERTIFICATE OF CORRECTION

PATENT NO. : 4,468,576
DATED : AUGUST 28, 1984
INVENTOR(S) : YOSHIHIRO TAKEMAE

It is certified that error appears in the above-identified patent and that said Letters Patent is hereby corrected as shown below:

Col. 2, line 21, "DARWINGS" should be --DRAWINGS--;
       line 65, "theshold" should be --threshold--.

Col. 3, line 1, "$100_1$" should be --$\phi_1$--;
       line 36, "$(V_{ss})$" should be --$(V_{SS})$--.

Col. 4, line 42, "paticularly" should be --particularly--.

Signed and Sealed this

Fifth Day of March 1985

[SEAL]

Attest:

DONALD J. QUIGG

Attesting Officer     Acting Commissioner of Patents and Trademarks